United States Patent
Kasuga et al.

[11] Patent Number: 5,976,766
[45] Date of Patent: Nov. 2, 1999

[54] CONTACT HOLE FORMING METHOD

[75] Inventors: Takashi Kasuga; Yoichi Tomo, both of Kanagawa, Japan

[73] Assignee: Sony Corporation, Japan

[21] Appl. No.: 08/018,313

[22] Filed: Feb. 16, 1993

[30] Foreign Application Priority Data

Feb. 21, 1992 [JP] Japan ................................ 4--72689

[51] Int. Cl.$^6$ .................................................. G03F 7/36
[52] U.S. Cl. ........................ 430/313; 430/317; 438/706
[58] Field of Search ............................ 430/31, 313, 317, 430/323, 945; 156/643, 644, 646, 653, 659.1, 662; 437/228, 229, 238, 241

[56] References Cited

U.S. PATENT DOCUMENTS

| | | | |
|---|---|---|---|
| 4,978,419 | 12/1990 | Nanda | 156/643 |
| 5,230,985 | 7/1993 | Lohaus | 430/325 |
| 5,310,624 | 5/1994 | Ehrlich | 430/322 |

OTHER PUBLICATIONS

CRC Handbook of Chemistry and Physics, 56$^{th}$ ed. (1976), Robert C. Weast, Ph.D., p. F–87

*Primary Examiner*—Kathleen Duda
*Attorney, Agent, or Firm*—Rader, Fishman & Grauer; Ronald P. Kananen

[57] ABSTRACT

A contact hole forming method uses a negative resist film having an absorptivity of 0.5 $\mu m^{-1}$ or above to suppress standing-wave effect in forming contact holes in a silicon dioxide film or the like underlying the negative resist film by anisotropic etching. The contact hole forming method comprises steps of: applying a negative resist having an absorptivity of 0.5 $\mu m^{-1}$ or above to the stepped surface of a stepped film formed on a substrate to form a negative resist film having a flat surface; exposing the negative resist film through a photomask to laser light emitted by a krypton fluoride excimer laser; developing the exposed negative resist film; and etching the silicon dioxide film or the like by anisotropic etching using the developed negative resist film as an etching mask and an etching gas containing a fluorocarbon or a mixture of a fluorocarbon and hydrogen to form contact holes. The negative resist film suppresses standing-wave effect, so that the contact holes can be formed in diameters accurately corresponding to the diameters of corresponding patterns of the photomask.

14 Claims, 3 Drawing Sheets

CONTACT HOLE FORMING METHOD

BACKGROUND OF THE INVENTION

1. Field of the Invention

The present invention relates to a method of forming contact holes when fabricating a semiconductor device.

2. Description of the Prior Art

A photolithographic process uses a KrF excimer laser that emits a KrF laser beam of 248 nm in wavelength as a light source for exposure, and a resist film of a resist which is relatively highly transmissive to a KrF laser beam in forming a pattern consisting of lines of a thickness in the range of 0.3 $\mu$m to 0.4 $\mu$m. Therefore, the dimensions of a pattern formed on the resist film are caused to deviate by the local variation of the thickness of the resist film due to steps formed in the base layer underlying the resist film and by a standing-wave effect resulting from the interaction of the transmissivity of the resist film and the reflectance of the base layer. Such deviation is more significant than that in g-line exposure or i-line exposure. To solve such a problem, a multilayer resist film is used or the resist film is formed over an antireflection film formed over the base layer. The photolithographic process uses a positive resist film highly absorptive to the exposure light to suppress the standing-wav e effect.

However, the use of a multilayer resist film or an antireflection film increases the number of steps of the photolithographic process. When the photolithographic process employs a positive resist film which is highly absorptive to the exposure light, pattern controllability is deteriorated greatly by the bulk effect.

For example referring to FIG. 1, if a positive resist film 11 which is highly absorptive to the exposure light is formed in a pattern having holes 12 and 13 on a stepped base layer 21, the holes 12 and 13 are tapered downward. Therefore, the respective diameters of the respective upper ends 14 and 15 of the holes 12 and 13 are greater than the respective diameters of the respective bottom ends 16 and 17 of the same holes. Accordingly, when the hole 12 is formed in a portion of the resist film 11 having a relatively small thickness and the hole 13 is formed in a portion of the resist film 11 having a relatively large thickness, the diameter of the bottom end 16 of the hole 12 is greater than that of the bottom end 17 of the hole 13. Thus, the diameter of the bottom end of a hole formed in the resist film is dependent on the thickness of the portion of the resist film in which the hole is formed. Hence it is difficult to adjust the sizes of holes formed in portions of the resist film formed over a stepped base layer and differing from each other in thickness.

If contact holes 23 and 24 are formed in the base layer 21 by using the resist film 11 having the holes 12 and 13 of such tapered shapes, the contact hole 23 corresponding to the hole 12, and the contact hole 24 corresponding to the hole 13 differ greatly from each other in diameter.

SUMMARY OF THE INVENTION

Accordingly, it is an object of the present invention to provide a contact hole forming method capable of accurately forming contact holes through simple processes.

A contact hole forming method in accordance with the present invention uses a negative resist film having an absorptivity of 0.50 $\mu m^{-1}$ or above to suppress standing-wave effect. Accordingly, holes of diameters substantially equal to the diameters of corresponding holes formed in a photomask can be formed accurately regardless of the thickness of portions of the negative resist film in which the holes are formed, which improves pattern controllability.

Since contact holes are formed in a layer underlying the negative resist film having a pattern of holes corresponding to the contact holes by using the negative resist film by an anisotropic etching process which scarcely etches the negative resist film, the contact holes are formed in diameters substantially equal to those of the upper ends of the corresponding holes of the negative resist film. Thus, the sizes of the contact holes formed in the layer can be accurately adjusted.

Since the method needs neither a multilayer resist film nor antireflection film, the method can be simply carried out.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

A plurality of steps in process for carrying out a contact hole forming method in a preferred embodiment according to the present invention will be described with reference to FIGS. 2(1) to 2(4).

Figure 1:
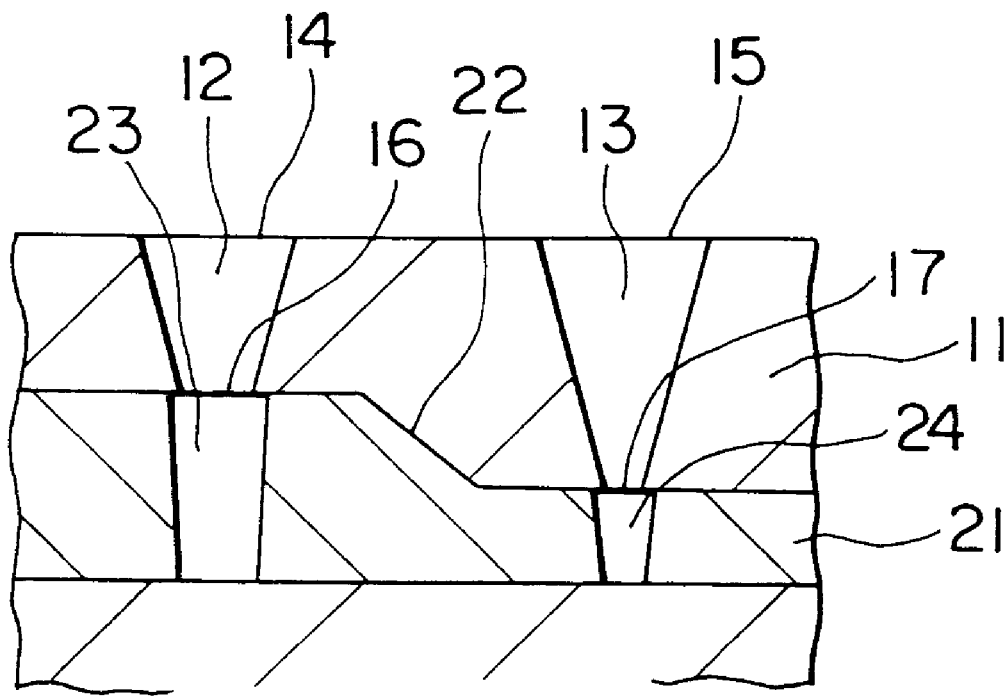
FIG. 1 is a schematic sectional view of assistance in explaining problems in the prior art contact hole forming method.
Figure 2:
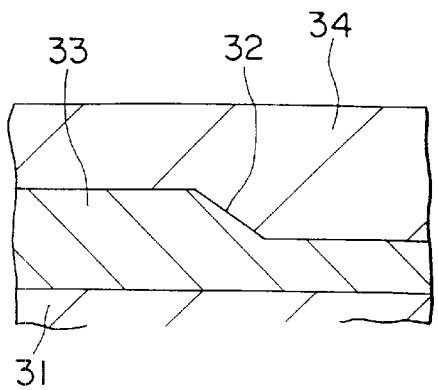
FIGS. 2(1), 2(2), 2(3) and 2(4) are schematic sectional views of assistance when explaining the steps in processes for carrying out a contact hole forming method in a preferred embodiment according to the present invention.
Figure 2:
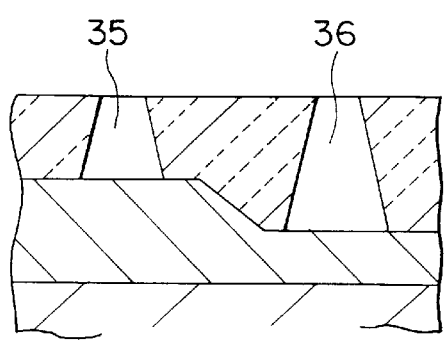
Figure 2:
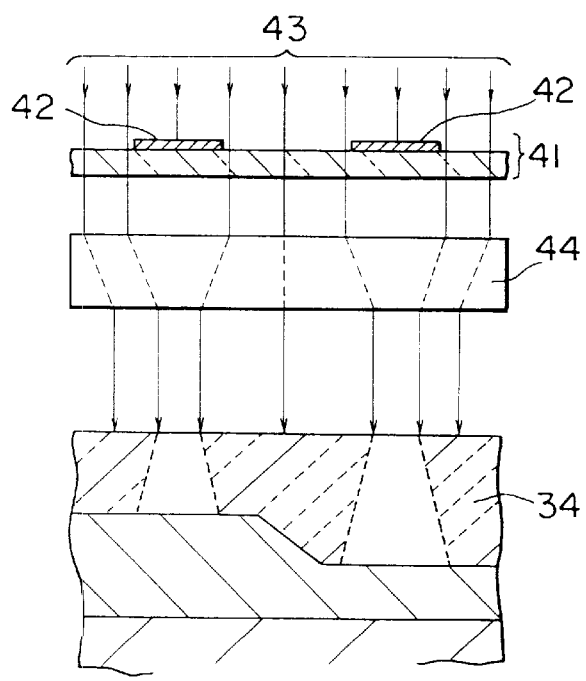
Figure 2:
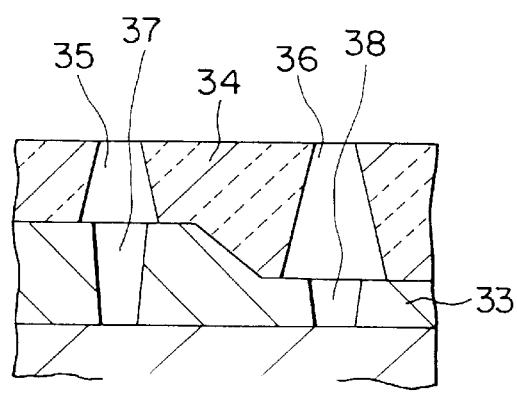

Referring to FIG. 2(1), a stepped film 33 having a step 32 is formed on a substrate 31. In a first process, a negative resist film 34 of 0.7 $\mu$m in thickness having a flat surface is formed over the stepped film 33 by spreading a negative resist 34 having an absorptivity of 0.5 $\mu m^{-1}$ or above to the exposure light 43 by a known film forming method. The negative resist film 34 has a thin portion extending over a portion of the stepped film 33 on the step 32, and a thick portion extending over a portion of the stepped film 33 extending on a level below that of the step 32. The negative resist film 34 is prebaked, for example, at a baking temperature of 90° C. for ninety seconds.

Referring to FIG. 2(2), in a second process, the negative resist film 34 is exposed to laser light of 248 nm in wavelength emitted by, for example, a KrF (krypton fluoride) excimer laser through a photomask 41 having screening patterns 42. A stepping projection aligner provided with a demagnification optical system 44 of 0.37 in numerical aperture and 5:1 in reduction ratio is used for exposing the negative resist film 34 to the laser light. Thus, the screening patterns 42 of the photomask 41 are transferred to the negative resist film 34 and portions of the negative resist film 34 shaded by diagonal lines are exposed to the laser light. Then, the exposed negative resist film 34 is subjected to postbaking, in which the exposed negative resist film 34 is baked, for example, at a baking temperature of 110° C. for ninety seconds.

Referring to FIG. 2(3), in a third step of the process, the exposed negative resist film 34 is developed to form holes 35 and 36 in a pattern corresponding to the screening pattern of the photomask 41. The exposed negative resist film 34 can be developed by, for example, a paddle development process in ten minutes. The hole 35 is formed in a relatively thin portion of the negative resist film 34, and the hole 36 is formed in a relatively thick portion of the negative resist film 34.

Since the absorptivity to the laser light 43 is 0.50 $\mu m^{-1}$ or above, the shapes of the holes 35 and 36 are scarcely affected by the standing-wave effect of the stepped film 33. The respective diameters of the upper ends of the holes 35 and 36 are proportional to those of the screening patterns 42 at a proportional constant equal to the reduction ratio of the demagnification optical system 44.

If the absorptivity of the negative resist film 34 to the laser light 43 is less than 0.50 $\mu m^{-1}$, the pattern controllability will be deteriorated and the respective sizes of the holes 35 and 36 will be affected by the standing-wave effect of the stepped film 33.

Referring to FIG. 2(4), in a fourth step of the process, contact holes 37 and 38 respectively corresponding to the holes 35 and 36 are formed in the stepped film 33 by anisotropic etching, which scarcely etches the negative resist film 34, using the negative resist film 34 having the holes 35 and 36 as an etching mask.

The contact hole forming method will be concretely described supposing that the height of the step 32 is in the range of 0.1 $\mu m$ to 0.3 $\mu m$, the stepped film 33 is a silicon oxide film, and the respective diameters of the contact holes 37 and 38 are 0.4 $\mu m$.

The negative resist film 34 is formed of a negative resist having an absorptivity of 0.92 $\mu m^{-1}$ to the exposure laser light 43 of 248 nm in wavelength emitted by a KrF excimer laser, the exposure is, for example, 60 mJ/cm$^2$, and the exposed negative resist film 34 is developed by the conventional developing process. The anisotropic etching uses an etching gas having a selectivity of 10 or above with the stepped film 33 and the negative resist film 34, such as a fluorocarbon etching gas, for example, octafluorocyclobutane ($C_4F_8$), trifluoromethane ($CHF_3$) or tetrafluoromethane ($CF_4$), or a mixed etching gas consisting of a fluorocarbon etching gas and hydrogen.

The difference in diameter between the contact holes 37 and 38 formed by anisotropic etching is within about ±10%.

Figure 3:
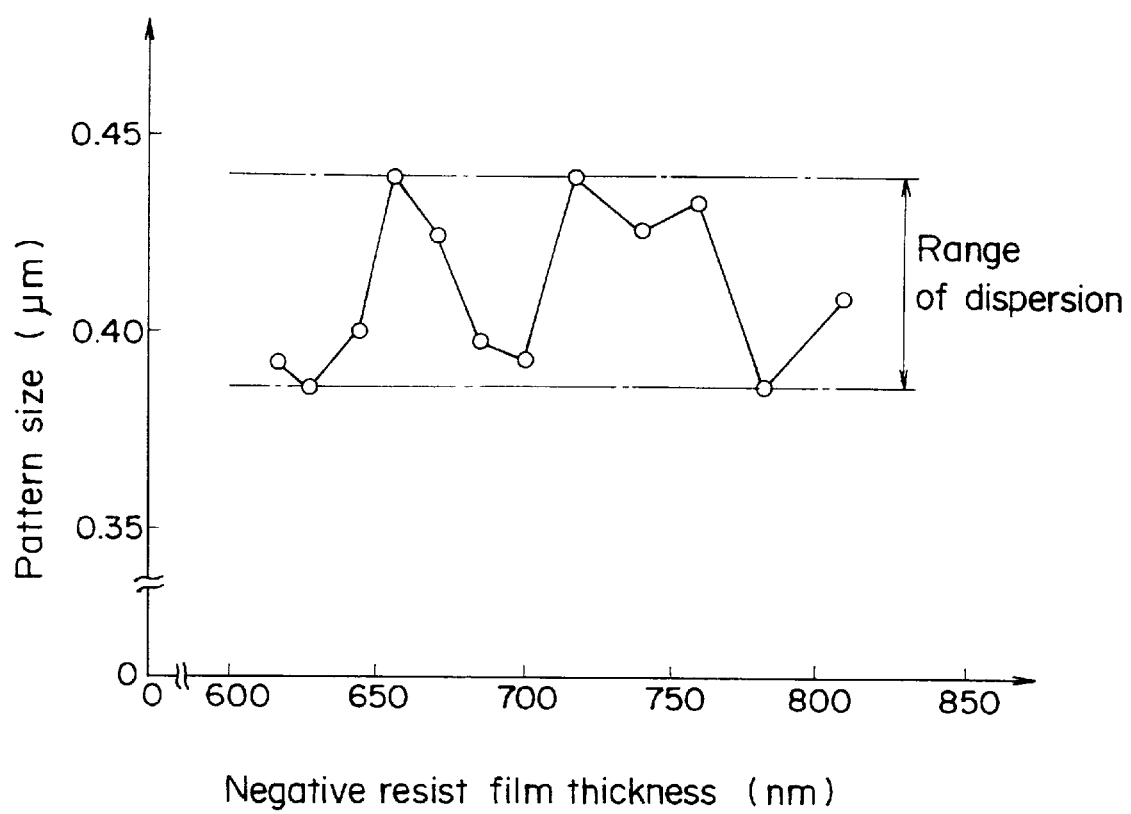
FIG. 3 is a graph of assistance in explaining the standing-wave effect with a resist film having an absorptivity of 0.92 $\mu m^{-1}$.

The standing-wave effect with the negative resist film 34 formed of a negative resist having an absorptivity of 0.92 $\mu m^{-1}$, when laser light emitted by a KrF excimer laser is used as exposure light, is shown in FIG. 3, in which the size of patterns is measured on the vertical axis and the thickness of the negative resist film 34 is measured on the horizontal axis. As is evident from FIG. 3, the range of dispersion of the sizes of patterns due to the standing-wave effect is about 0.05 $\mu m$ and the influence of the standing-wave effect on the sizes of patterns is practically negligible. If the negative resist film 34 is formed in an optimum thickness taking into consideration the height of the step 32, the sizes of the patterns are scarcely affected by the standing-wave effect.

Although the contact hole forming method of the present invention has been described as applied to forming the contact holes 37 and 38 in the stepped film 33 of silicon dioxide, the contact hole forming method is capable of forming the contact holes 37 and 38 in accurate sizes even if the stepped film 33 is formed of a material other than silicon dioxide, such as silicon nitride. When forming the contact holes 37 and 38 in a stepped film 33 of silicon nitride, the contact hole forming method uses an etching gas having a selectivity of 10 or above with the negative resist film 34 and the stepped film 33, such as a fluorocarbon gas, for example, tetrafluoromethane ($CF_4$), trifluoromethane ($CHF_3$) or perfluoropropane ($C_3F_8$), a mixed etching gas of a fluorocarbon and hydrogen or a mixed etching gas of a fluorocarbon and oxygen.

In a preferred embodiment of the present invention, the etching gas used for the anisotropic etching of the stepped layer contains at least one member of the group consisting of tetraflouromethane, trifluoromethane, perfluorpropane, a mixture of hydrogen and octafluorocyclobutane, and a mixture of hydrogen and tetrafluoromethane.

As is apparent from the foregoing description, the contact hole forming method of the present invention is capable of forming contact holes in accurate sizes in a stepped film regardless of a difference in thickness between portions of the stepped film in which the contact holes are respectively formed.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method for forming contact holes in a layer of a semiconductor device, comprising the steps of:

forming the layer to be etched on a substrate, said layer having a stepped surface;

coating a negative resist film on the layer until the stepped surface of the layer has a flat surface;

patterning the negative resist film to correspond to the contact holes; and etching the layer by anisotropic etching using the resist film as an etching mask.

2. A method for forming contact holes according to claim 1, wherein said negative resist film has an absorptivity of 0.50 $\mu m^{-1}$ or above to an exposure light.

3. A method for forming contact holes according to claim 2 wherein said exposure light is emitted by a KrF excimer laser.

4. A method for forming contact holes according to claim 1, wherein said layer comprises a silicon dioxide film.

5. A method for forming contact holes according to claim 4, wherein said etching is conducted by using an etching gas comprising at least one member selected from the group consisting of octafluorocyclobutane, tetrafluoromethane, trifluoromethane, perfluoropropane, a mixture of hydrogen and octaf luorocyclobutane, a mixture of hydrogen and trifluoromethane, and a mixture of hydrogen and tetrafluoromethane.

6. A method for forming contact holes according to claim 5, wherein said etching gas is at least one member selected from the group consisting of octafluorocyclobutane ($CF_4F_8$), trifluoromethane ($CHF_3$), and tetraf luoromethane ($CF_4$) and wherein said etching comprises etching the layer by an anisotropic etching using the resist film as a mark to thereby form contact holes in the insulating layer.

7. A method for forming contact holes according to claim 4, wherein said etching is conducted by using an etching gas containing a fluorocarbon or a mixture of hydrogen and a fluorocarbon.

8. A method for forming contact holes according to claim 9, wherein said fluorocarbon is at least one member selected from the group consisting of octafluorocyclobutane ($CF_4C_8$) trifluoromethane ($CHF_3$), and tetrafluoromethane ($CF_4$) and wherein said etching comprises etching the layer by an anisotropic etching using the resist film as a mark to thereby form contact holes in the insulating layer.

9. A method for forming contact holes according to claim 1, wherein said layer comprises a silicon nitride film.

10. A method for forming contact holes according to claim 9, wherein said etching is conducted by using an etching gas comprising at least one member selected from the group consisting of tetrafluoromethane, trifluoromethane perfluoropropane, a mixture of hydrogen and octafluorocyclobutane, a mixture of hydrogen and trifluoromethane and a mixture of hydrogen and tetrafluoromethane.

11. A method for forming contact holes according to claim 7, wherein said etching gas is at least one member selected from the group consisting of tetrafluoromethane ($CF_4$), trifluoromethane ($CHF_3$), and perfluoropropane ($C_3F_8$).

12. A method for forming contact holes according to claim 6, wherein said etching is conducted by using an etching gas containing a fluorocarbon or a mixture of hydrogen, oxygen, and a fluorocarbon.

13. A method for forming contact holes according to claim 10, wherein said fluorocarbon is at least one member selected from the group consisting of tetrafluoromethane ($CF_4$), trifluoromethane ($CHF_3$), and perfluoropropane ($C_3F_8$).

14. A method for forming contact holes comprising the steps of:

forming an insulating layer to be etched on a substrate, said insulating layer having a stepped surface;

coating a negative resist film on the insulating layer until the stepped surface has a flat surface, said negative resist film having an absorptivity of $0.50 \,\mu m^{-1}$ or above to a KrF excimer laser;

patterning the negative resist film to correspond to at least two contact holes, one of the contact holes being formed on an upper portion of the stepped surface, and the other being formed on a lower portion of the stepped surface; and etching the insulating layer by an anisotropic etching using the resist film as a mask to thereby form contact holes in the insulating layer.

\* \* \* \* \*